(12) United States Patent
Su

(10) Patent No.: US 10,405,455 B2
(45) Date of Patent: Sep. 3, 2019

(54) FAN SPEED-ADJUSTMENT POLICY FOR ENTIRE MACHINE CABINET BY PLACING FAN TABLE ON NODE BMC

(71) Applicant: INSPUR ELECTRONIC INFORMATION INDUSTRY CO., LTD, Jinan, Shandong (CN)

(72) Inventor: Xiao Su, Shandong (CN)

(73) Assignee: INSPUR ELECTRONIC INFORMATION INDUSTRY CO., LTD., Jinan, Shandong (CN)

( * ) Notice: Subject to any disclaimer, the term of this patent is extended or adjusted under 35 U.S.C. 154(b) by 0 days.

(21) Appl. No.: 15/745,093

(22) PCT Filed: Mar. 10, 2016

(86) PCT No.: PCT/CN2016/076025
§ 371 (c)(1),
(2) Date: Jan. 15, 2018

(87) PCT Pub. No.: WO2017/063331
PCT Pub. Date: Apr. 20, 2017

(65) Prior Publication Data
US 2018/0206363 A1 Jul. 19, 2018

(30) Foreign Application Priority Data

Oct. 14, 2015 (CN) .......................... 2015 1 0664278

(51) Int. Cl.
*G06F 1/20* (2006.01)
*H05K 7/20* (2006.01)

(52) U.S. Cl.
CPC ........... *H05K 7/20209* (2013.01); *G06F 1/20* (2013.01); *G06F 1/206* (2013.01); *H05K 7/207* (2013.01); *H05K 7/20172* (2013.01)

(58) Field of Classification Search
CPC ........ G06F 1/20; G05D 23/00; H05K 17/207; H05K 7/20
See application file for complete search history.

(56) References Cited

U.S. PATENT DOCUMENTS

2008/0306633 A1* 12/2008 Tunks ................ G05D 23/1919
700/300
2010/0100254 A1* 4/2010 Artman .............. H05K 7/20836
700/299

(Continued)

FOREIGN PATENT DOCUMENTS

| CN | 102510344 A | 6/2012 |
| CN | 102594602 A | 7/2012 |

(Continued)

OTHER PUBLICATIONS

International Search Report for PCT/CN2016/076025, dated Jul. 12, 2016, ISA/CN.

*Primary Examiner* — Eduardo Colon Santana
*Assistant Examiner* — Said Bouziane
(74) *Attorney, Agent, or Firm* — Yue (Robert) Xu; Apex Attorneys at Law, LLP

(57) ABSTRACT

A rack fan speed regulation method based on a fan table provided in a node BMC is provided, which includes: providing a fan table reflecting a rack fan speed regulation policy in a BMC of each node server; acquiring, by the node BMC, a parameter reflecting a heat dissipation condition of a node motherboard; and acquiring, by the node BMC based on the speed regulation policy, a fan rotation speed corresponding to the parameter rapidly. With the rack fan speed regulation method, the node BMC can rapidly obtain parameters reflecting a heat dissipation condition of a node motherboard, and rapidly obtain a corresponding fan rotation speed based on the speed regulation policy. In this case, heat (Continued)

dissipation of the node can be controlled effectively in a timely manner, thereby ensuring heat dissipation of the rack.

4 Claims, 1 Drawing Sheet

(56) References Cited

U.S. PATENT DOCUMENTS

| | | | | |
|---|---|---|---|---|
| 2012/0131249 | A1* | 5/2012 | Cepulis | G06F 1/189 |
| | | | | 710/269 |
| 2013/0126150 | A1* | 5/2013 | Huang | G05D 23/1932 |
| | | | | 165/300 |
| 2013/0159762 | A1* | 6/2013 | Chiu | G06F 11/2033 |
| | | | | 714/4.11 |
| 2014/0154049 | A1* | 6/2014 | Huang | F04D 27/004 |
| | | | | 415/1 |
| 2014/0277750 | A1* | 9/2014 | Artman | G05B 15/02 |
| | | | | 700/275 |
| 2014/0277784 | A1 | 9/2014 | Mick et al. | |
| 2015/0177750 | A1* | 6/2015 | Bailey | H05K 7/20736 |
| | | | | 700/275 |
| 2016/0037686 | A1* | 2/2016 | Shabbir | G06F 1/206 |
| | | | | 700/300 |
| 2016/0150353 | A1* | 5/2016 | Wu | H04W 4/38 |
| | | | | 455/41.2 |
| 2016/0309621 | A1* | 10/2016 | Chen | H05K 7/20836 |
| 2018/0352677 | A1* | 12/2018 | Chen | G06F 1/206 |

FOREIGN PATENT DOCUMENTS

| | | |
|---|---|---|
| CN | 104122910 A | 10/2014 |
| CN | 105278646 A | 1/2016 |

\* cited by examiner

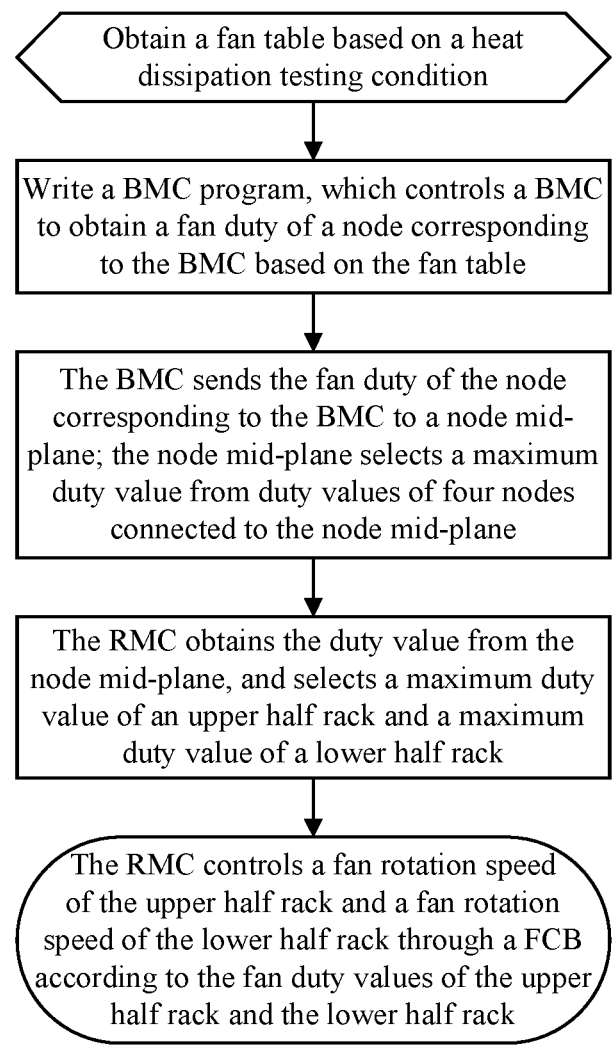

FAN SPEED-ADJUSTMENT POLICY FOR ENTIRE MACHINE CABINET BY PLACING FAN TABLE ON NODE BMC

FIELD

This application is the national phase of International Application No. PCT/CN2016/076025, titled "FAN SPEED-ADJUSTMENT POLICY FOR ENTIRE MACHINE CABINET BY PLACING FAN TABLE ON NODE BMC", filed on Mar. 10, 2016, which claims the priority to Chinese Patent Application No. 201510664278.3, titled "FAN SPEED-ADJUSTMENT POLICY FOR ENTIRE MACHINE CABINET BY PLACING FAN TABLE ON NODE BMC", filed with the Chinese State Intellectual Property Office on Oct. 14, 2015, both of which are incorporated herein by reference in their entireties.

The present disclosure relates to the technical field of server rack heat dissipation, and in particular to a rack fan speed regulation method based on a fan table provided in a node BMC.

BACKGROUND

With the development of computer technologies, rack servers are more and more widely used in practical applications, especially in application scenarios such as a large data center and a cloud computing base. Generally, dozens of server nodes are integrated in a rack to achieve a high-density deployment. In the rack, CPU of each node does not have a separate fan for heat dissipation. Instead, all the nodes are collectively cooled with a fan window at the back of the rack. Generally, in the rack server, a node mid-plane collects data including CPU temperatures and intake vent temperatures of nodes, and transmits the data to a RMC (Rack Management Controller), which then obtains a fan duty value based on a fan table provided in the RMC to control the fan. This method has a significant disadvantage that it takes a long time from the time instant at which the CPU temperature and the intake vent temperature of the node change to the time instant at which the RMC obtains a new fan duty value based on the change, thus the node cannot be cooled effectively and in a timely manner when the load on the server node is heavy and the CPU temperature is high. The method inevitably increases the risk in heat dissipation, and can lead to a reduction in the CPU operational frequency in severe cases. Therefore, it is urgent for designers and developers to develop a method for effectively dissipating heat from the server nodes in a timely manner.

Technical Issue

A technical issue to be solved by the present disclosure is to provide a rack fan speed regulation method based on a fan table provided in a node BMC, with which a fan duty value can be rapidly obtained when a CPU temperature of a node increases, thereby increasing a rotation speed of the fan in a timely manner, thus timely and effective heat dissipation of a rack can be ensured.

Solution to the Technical Issue

Technical Solution

The following technical solution is provided according to the present disclosure.

A rack fan speed regulation method based on a fan table provided in a node BMC is provided according to the present disclosure. According to the method, a fan table reflecting a rack fan speed regulation policy is provided in a BMC of each node server. As compared with the conventional method where the fan table is provided in a rack management controller RMC responsible for managing a rack, providing the fan table in the BMC of each node server has a unique advantage, which is: the node BMC can rapidly obtain parameters reflecting a heat dissipation condition of a node motherboard, such as a CPU temperature and an intake vent temperature of the node, and rapidly obtain a corresponding fan rotation speed based on the speed regulation policy. In this case, heat dissipation of the node can be controlled effectively in a timely manner, thereby ensuring heat dissipation of the rack.

Specifically, the method includes:

1) performing a heat dissipation test to obtain a fan regulation policy table, hereinafter referred to as a fan table, including different CPU temperatures and different ambient temperatures;

2) writing, based on the fan table, BMC speed regulation policy program codes, which control the node BMC to obtain, based on a CPU temperature and an intake vent temperature of the node server at which the node BMC is located, a fan duty value of a node corresponding to the node BMC, and send the fan duty value to a node mid-plane;

3) writing a node mid-plane fan control program, which controls the node mid-plane to select a maximum fan duty value from fan duty values of four nodes connected to the node mid-plane and located on a same layer as the node mid-plane, to obtain a fan duty value of the node mid-plane of the layer; and 4) writing a RMC fan control program, which controls a RMC to obtain the fan duty value of the node mid-plane of each layer from the node mid-plane, obtain a maximum fan duty value of node mid-planes in an upper half rack and a maximum fan duty value of node mid-planes in a lower half rack, and separately control a fan rotation speed of a fan window corresponding to nodes of the upper half rack and a fan rotation speed of a fan window corresponding to nodes of the lower half rack through a fan control board, to separately control fans in the upper half rack and fans in the lower half rack.

The node BMC sends the fan duty value of the node corresponding to the node BMC to the node mid-plane via an I2C bus.

The RMC obtains the fan duty value of the node mid-plane of each layer from the node mid-plan via an I2C bus.

ADVANTAGEOUS EFFECT OF THE PRESENT DISCLOSURE

Advantageous Effect

The present disclosure has the following advantageous effect.

According to the present disclosure, when the load on the node increases and the CPU temperature rises, or the ambient temperature rises, fan duty values can be rapidly obtained, and the RMC can increase the rotation speed of the fan in a timely manner based on the obtained maximum fan duty value, thereby ensuring that head from the rack can be dissipated effectively and in a timely manner, and the heat dissipation can accommodate changes in the ambient temperature more rapidly, thus system reliability and maintainability are improved. Therefore, the speed regulation method has a unique advantage in heat dissipation of the SmartRack rack server.

BRIEF DESCRIPTION OF THE DRAWINGS

Description of the Drawings

FIG. 1 is a flow chart of the method according to the present disclosure.

DETAILED DESCRIPTION OF THE EMBODIMENTS

The Embodiments of the Present Disclosure

Hereinafter, the present disclosure will be further described in accordance with the drawings and in conjunction with specific embodiments.

First Embodiment

A rack fan speed regulation method based on a fan table provided in a node BMC is provided according to the present disclosure. According to the method, a fan table reflecting a rack fan speed regulation policy is provided in a BMC of each node server. As compared with the conventional method where the fan table is provided in a rack management controller RMC responsible for managing a rack, providing the fan table in the BMC of each node server has a unique advantage, which is: the node BMC can rapidly obtain parameters reflecting a heat dissipation condition of a node motherboard, such as a CPU temperature and an intake vent temperature of the node, and rapidly obtain a corresponding fan rotation speed based on the speed regulation policy. In this case, heat dissipation of the node can be controlled effectively in a timely manner, thereby ensuring heat dissipation of the rack.

Second Embodiment

Reference is made to FIG. 1. On the basis of the first embodiment, the method according to this embodiment includes the following steps 1) to 4).

In step 1), a heat dissipation test is performed to obtain a fan regulation policy table, hereinafter referred to as a fan table, including different CPU temperatures and different ambient temperatures.

In step 2), BMC speed regulation policy program codes are written based on the fan table. The BMC speed regulation policy program codes control the node BMC to obtain, based on a CPU temperature and an intake vent temperature of the node server at which the node BMC is located, a fan duty value of a node corresponding to the node BMC, and send the fan duty value to a node mid-plane.

In step 3), a node mid-plane fan control program is written. The node mid-plane fan control program controls the node mid-plane to select a maximum fan duty value from fan duty values of four nodes connected to the node mid-plane and located on a same layer as the node mid-plane, to obtain a fan duty value of the node mid-plane of the layer.

In step 4), a RMC fan control program is written. The RMC fan control program controls a RMC to obtain the fan duty value of the node mid-plane of each layer from the node mid-plane, obtain a maximum fan duty value of node mid-planes in an upper half rack and a maximum fan duty value of node mid-planes in a lower half rack, and separately control a fan rotation speed of a fan window corresponding to nodes of the upper half rack and a fan rotation speed of a fan window corresponding to nodes of the lower half rack through a fan control board, to separately control fans in the upper half rack and fans in the lower half rack.

Third Embodiment

On the basis of the second embodiment, in this embodiment, the node BMC sends the fan duty value of the node corresponding to the node BMC to the node mid-plane via an I2C bus.

Fourth Embodiment

On the basis of the second embodiment or the third embodiment, in this embodiment, the RMC obtains the fan duty value of the node mid-plane of each layer from the node mid-plan via an I2C bus.

The above embodiments are intended to be illustrative only, and are not intend to limit the present disclosure. Various changes and variations can be made by those skilled in the art without departing from the spirit and scope of the present disclosure. Therefore, all equivalent technical solutions are also fall within the scope of the present disclosure. The scope of protection of the present disclosure is defined by the claims.

The invention claimed is:

1. A rack fan speed regulation method based on a fan regulation policy table provided in a node BMC, comprising:
providing a fan regulation policy table reflecting a rack fan speed regulation policy in a BMC of each node server, wherein the fan regulation policy table is obtained based on a heat dissipation test and comprises different CPU temperatures and different ambient temperatures;
acquiring, by the node BMC, a parameter reflecting a heat dissipation condition of a node motherboard, wherein the parameter comprises a CPU temperature and an intake vent temperature of the node server;
acquiring, by the node BMC based on the speed regulation policy, a fan duty value of a node corresponding to the node BMC based on the CPU temperature and the intake vent temperature of the node server;
sending, by the node BMC, the fan duty value to a node mid-plane;
selecting, by the node mid-plane, a maximum fan duty value from fan duty values of four nodes connected to the node mid-plane and located on a same layer as the node mid-plane, to obtain a fan duty value of the node mid-plane of the layer;
acquiring, by an RMC, the fan duty value of the node mid-plane of each layer from the node mid-plane; and
acquiring, by the RMC, a maximum fan duty value of node mid-planes in an upper half rack and a maximum fan duty value of node mid-planes in a lower half rack, and separately controlling, by the RMC, a fan rotation speed of a fan window corresponding to nodes of the upper half rack and a fan rotation speed of a fan window corresponding to nodes of the lower half rack through a fan control board, to separately control fans in the upper half rack and fans in the lower half rack.

2. The rack fan speed regulation method based on a fan regulation policy table provided in a node BMC according to claim 1, wherein the node BMC sends the fan duty value of the node corresponding to the node BMC to the node mid-plane via an I2C bus.

3. The rack fan speed regulation method based on a fan regulation policy table provided in a node BMC according to claim 2, wherein the RMC obtains the fan duty value of the node mid-plane of each layer from the node mid-plan via an I2C bus.

4. The rack fan speed regulation method based on a fan regulation policy table provided in a node BMC according to claim 2, wherein the RMC obtains the fan duty value of the node mid-plane of each layer from the node mid-plan via an I2C bus.

\* \* \* \* \*

UNITED STATES PATENT AND TRADEMARK OFFICE
CERTIFICATE OF CORRECTION

PATENT NO. : 10,405,455 B2  
APPLICATION NO. : 15/745093  
DATED : September 3, 2019  
INVENTOR(S) : Xiao Su Page 1 of 1

It is certified that error appears in the above-identified patent and that said Letters Patent is hereby corrected as shown below:

In the Claims

Column 5 Line 6, dependent Claim 3 should depend from Claim 1 instead of Claim 2.

Signed and Sealed this
Tenth Day of March, 2020

Andrei Iancu
*Director of the United States Patent and Trademark Office*